US011346900B2

(12) United States Patent
Uchida (10) Patent No.: US 11,346,900 B2
(45) Date of Patent: *May 31, 2022

(54) MAGNETIC SENSOR WITH ELONGATED SOFT MAGNETIC BODY

(71) Applicant: TDK Corporation, Tokyo (JP)

(72) Inventor: Keisuke Uchida, Tokyo (JP)

(73) Assignee: TDK Corporation, Tokyo (JP)

(*) Notice: Subject to any disclaimer, the term of this patent is extended or adjusted under 35 U.S.C. 154(b) by 33 days.

This patent is subject to a terminal disclaimer.

(21) Appl. No.: 16/936,866

(22) Filed: Jul. 23, 2020

(65) Prior Publication Data

US 2020/0355759 A1 Nov. 12, 2020

Related U.S. Application Data

(63) Continuation of application No. 16/053,936, filed on Aug. 3, 2018, now Pat. No. 10,768,246.

(30) Foreign Application Priority Data

Sep. 21, 2017 (JP) .............................. JP2017-181246
May 30, 2018 (JP) .............................. JP2018-103366

(51) Int. Cl.
*G01R 33/09* (2006.01)
*G01R 33/00* (2006.01)
(Continued)

(52) U.S. Cl.
CPC ....... *G01R 33/093* (2013.01); *G01R 33/0005* (2013.01); *G01R 33/0206* (2013.01); *H01L 43/08* (2013.01)

(58) Field of Classification Search
CPC .... G01R 33/09; G01R 33/093; G01R 33/098; G01R 33/02; G01R 33/096;
(Continued)

(56) References Cited

U.S. PATENT DOCUMENTS 6,002,553 A 12/1999 Stearns et al.
7,777,607 B2 * 8/2010 Taylor ................. H01F 10/3272
338/32 R
(Continued)

FOREIGN PATENT DOCUMENTS

JP 2011-007673 A 1/2011
JP 2012-255796 A 12/2012
(Continued)

*Primary Examiner* — Vinh P Nguyen
(74) *Attorney, Agent, or Firm* — Posz Law Group, PLC (57) ABSTRACT

A magnetic sensor detects a Z-axis magnetic field via a yoke and enhances the accuracy with which a magnetic field is detected. The magnetic sensor has a first magnetic field detecting element that is arranged in a plane that includes a first direction and a second direction. The second direction is perpendicular to the first direction. The first magnetic field detecting element detects a magnetic field in the first direction. In a soft magnetic body that is adjacent to the first magnetic field detecting element in the first direction, L/W is equal to or more than 10, where W is a length of the soft magnetic body in the first direction, and L is a length of the soft magnetic body in the second direction.

16 Claims, 5 Drawing Sheets

(51) Int. Cl.
*G01R 33/02* (2006.01)
*H01L 43/08* (2006.01)

(58) Field of Classification Search
CPC .......... G01R 33/0011; G01R 33/091; G01R 15/205; G01R 33/0206; G01R 33/04; G01R 15/207; G01R 33/06; G01R 15/20; G01R 33/0052; G01R 33/063; G01R 33/05; G01R 33/072; G01R 33/1284; G01R 33/0005; G01R 33/12; G01R 33/18; G01R 33/0094; G01R 33/1276; G01R 33/077; G01R 17/105; H01F 41/046; H01F 41/325; H01F 10/30; H01F 10/324; H01F 41/16; H01F 27/24; H01F 10/32; H01F 41/0246; H01F 41/02; H01F 13/003; H01F 2017/0066; H01F 1/147; H01F 41/34; H01F 10/265; H01F 27/245; H01F 1/14775; H01F 41/042; H01F 1/00; H01F 1/12; H01F 1/0306; H01F 10/13; H01F 1/0572; H01F 10/28; H01F 2038/127; H01F 2017/0086; H01F 10/138; H01F 41/0213; H01F 10/00; G06F 7/383; G06F 21/87; G06F 3/046; G01B 7/003; G01B 7/30; G01B 7/004; G01B 7/00; G01B 7/16; G01B 11/026
See application file for complete search history.

(56) References Cited

U.S. PATENT DOCUMENTS

| | | | | |
|---|---|---|---|---|
| 8,184,408 | B2* | 5/2012 | Murakami | G11B 5/3906 360/324.11 |
| 9,182,458 | B2* | 11/2015 | Lee | B82Y 25/00 |
| 9,581,661 | B2* | 2/2017 | Zimmer | G01R 33/0052 |
| 10,444,303 | B2 | 10/2019 | Obana et al. | |
| 10,768,246 | B2* | 9/2020 | Uchida | G01R 33/093 |
| 2004/0150397 | A1 | 8/2004 | Kuroe et al. | |
| 2011/0151589 | A1 | 6/2011 | Redon | |
| 2016/0202329 | A1 | 7/2016 | Paci | |

FOREIGN PATENT DOCUMENTS

| | | |
|---|---|---|
| JP | 5597206 B | 8/2014 |
| JP | 2015-203647 A | 11/2015 |
| JP | 2017-096714 A | 6/2017 |

* cited by examiner

MAGNETIC SENSOR WITH ELONGATED SOFT MAGNETIC BODY

CROSS REFERENCE TO RELATED APPLICATIONS

The present application is a continuation application of U.S. Utility application Ser. No. 16/053,936 filed on Aug. 3, 2018, now U.S. Pat. No. 10,768,246, which is based on, and claims priority from, JP Applications No. 2017-181246, filed on Sep. 21, 2017 and 2018-103366, filed on May 30, 2018, the contents of which are incorporated herein by reference.

BACKGROUND OF THE INVENTION

The present invention relates to a magnetic sensor, and particularly to the configuration of a yoke of the magnetic sensor.

DESCRIPTION OF THE RELATED ART

A magnetic sensor that includes a magneto-resistive effect element has been known. A magneto-resistive effect element has a magnetic field sensing film that detects a magnetic field. The magnetic field sensing film detects a magnetic field in an in-plane direction of the film. Recently, there is a need of a magnetic sensor that detects a magnetic field in a direction that is perpendicular to the in-plane direction of the magnetic field sensing film (hereinafter referred to as a Z-axis direction). JP5597206B discloses a magnetic sensor having a yoke that is formed of a soft magnetic material and that is provided adjacent to a magneto-resistive effect element. The yoke changes the direction of a Z-axis external magnetic field, which is absorbed by the yoke, to the in-plane direction of the magnetic field sensing film, thereby making it possible to detect a Z-axis magnetic field.

SUMMARY OF THE INVENTION

A magnetic sensor that detects an external magnetic field via a yoke causes hysteresis of the sensor output. Hysteresis is a phenomenon in which the sensor output for a magnetic field whose strength is increasing does not coincide with the sensor output for a magnetic field whose strength is decreasing at a certain magnetic field strength, thereby causing a difference of output between the former and the latter. A large hysteresis leads to deterioration of accuracy of the magnetic sensor.

An object of the present invention is to provide a magnetic sensor that detects a Z-axis magnetic field via a yoke and that enhances the accuracy with which a magnetic field is detected.

A magnetic sensor according to an embodiment comprises a first magnetic field detecting element that is arranged in a plane that includes a first direction and a second direction that is perpendicular to the first direction, wherein the first magnetic field detecting element detects a magnetic field in the first direction; and a soft magnetic body that is adjacent to the first magnetic field detecting element in the first direction. An aspect ratio L/W is equal to or more than 10, where W is a length of the soft magnetic body in the first direction, and L is a length of the soft magnetic body in the second direction.

A magnetic sensor according to another embodiment comprises a first magnetic field detecting element that is arranged in a plane that includes a first direction and a second direction that is perpendicular to the first direction, wherein the first magnetic field detecting element detects a magnetic field in the first direction; and a soft magnetic body that is adjacent to the first magnetic field detecting element in the first direction. An aspect ratio h/W satisfies $0.27 \leq h/W \leq 3$, where W is a length of the soft magnetic body in the first direction, and h is a length of the soft magnetic body in a third direction that is perpendicular both to the first direction and the second direction.

According to the present invention, it is possible to provide a magnetic sensor that detects a Z-axis magnetic field via a yoke and that enhances the accuracy with which a magnetic field is detected.

The above and other objects, features and advantages of the present invention will become apparent from the following description with reference to the accompanying drawings which illustrate examples of the present invention.

DETAILED DESCRIPTION OF EMBODIMENTS

A magnetic sensor according to some embodiments of the present invention will be described with reference to the attached drawings. In the following descriptions, the first direction is a magnetic field sensing direction in which magnetic field detecting elements detect a magnetic field and the first direction also corresponds to the direction in which the magnetic field detecting elements are arranged. The second direction is perpendicular to the first direction. The first and second direction are parallel to a surface on which the magnetic field detecting elements are arranged. The third direction is perpendicular both to the first direction and the second direction and corresponds to a direction in which multiple films that constitute a magnetic field detecting element are stacked. The first direction, the second direction and the third direction are also called the X direction, the Y direction and the Z direction, respectively.

Figure 1:
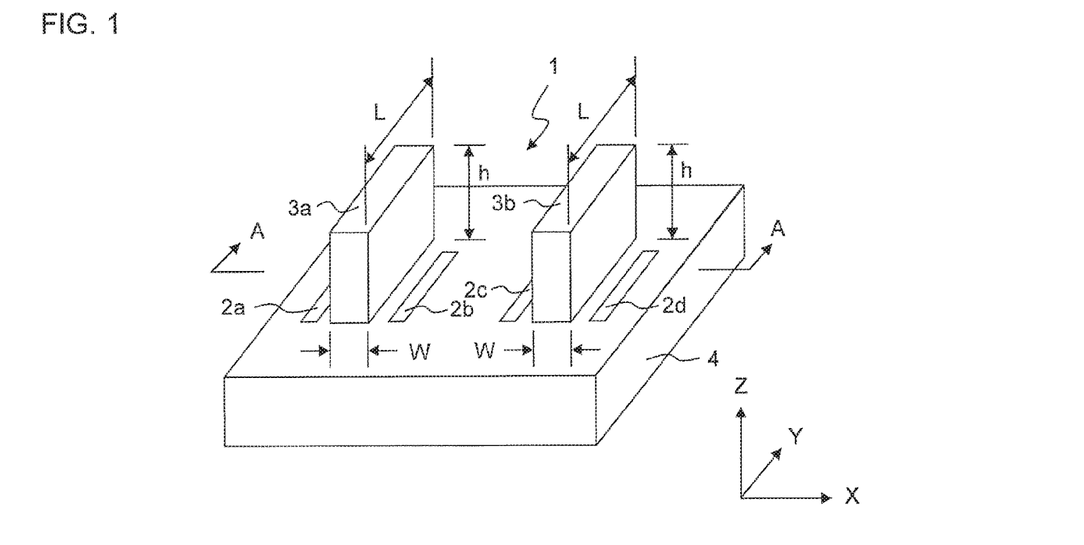
FIG. 1 is a conceptual perspective view of a magnetic sensor according to an embodiment of the present invention.

FIG. 1 shows a conceptual perspective view of magnetic sensor 1. Magnetic sensor 1 has first to fourth magnetic field detecting elements 2a, 2b, 2c, 2d that are arranged in first direction X. First to fourth magnetic field detecting elements 2a, 2b, 2c, 2d are arranged on a plane that includes first direction X and second direction Y and detects a magnetic field in first direction X. Each of first to fourth magnetic field detecting elements 2a, 2b, 2c, 2d has a substantially rectangular shape that is longer in second direction Y than in first direction X, as viewed in a plan view. First to fourth magnetic field detecting elements 2a, 2b, 2c, 2d are interconnected with each other by means of a bridge circuit (not shown), and thereby enabling magnetic sensor 1 to measure an external magnetic field.

First soft magnetic body 3a is arranged between first magnetic field detecting element 2a and second magnetic field detecting element 2b, and second soft magnetic body 3b is arranged between third magnetic field detecting element 2c and fourth magnetic field detecting element 2d. First and second soft magnetic bodies 3a, 3b are formed of NiFe or the like. First soft magnetic body 3a is adjacent to first and second magnetic field detecting elements 2a, 2b in first direction X, and second soft magnetic body 3b is adjacent to third and fourth magnetic field detecting element 2c, 2d in first direction X. First and second soft magnetic bodies 3a, 3b function as yokes that guide magnetic flux in third direction Z, that is absorbed by these soft magnetic bodies, to the magnetic field sensing direction of magnetic field detecting elements 2a, 2b, 2c, 2d, that is first direction X. Accordingly, first soft magnetic body 3a and first yoke are interchangeably used, and second soft magnetic body 3b and second yoke are interchangeably used in this specification. The external magnetic field that is inputted to first and second soft magnetic bodies 3a, 3b does not need to be exactly directed in first direction X as long as the component of first direction X is increased by the external magnetic field passing through first and second soft magnetic bodies 3a, 3b. First soft magnetic body 3a preferably has a length that is larger than the lengths of first and second magnetic field detecting elements 2a, 2b in second direction Y and that contains first and second magnetic field detecting elements 2a, 2b, as seen in first direction X, in order to increase the component of first direction X along the entire lengths of first and second magnetic field detecting elements 2a, 2b in second direction Y. Similarly, second soft magnetic body 3b preferably has a length that is larger than the lengths of third and fourth magnetic field detecting element 2c, 2d in second direction Y and that contains third and fourth magnetic field detecting element 2c, 2d, as seen in first direction X, in order to increase the component of first direction X along the entire lengths of third and fourth magnetic field detecting element 2c, 2d in second direction Y.

Figure 2:
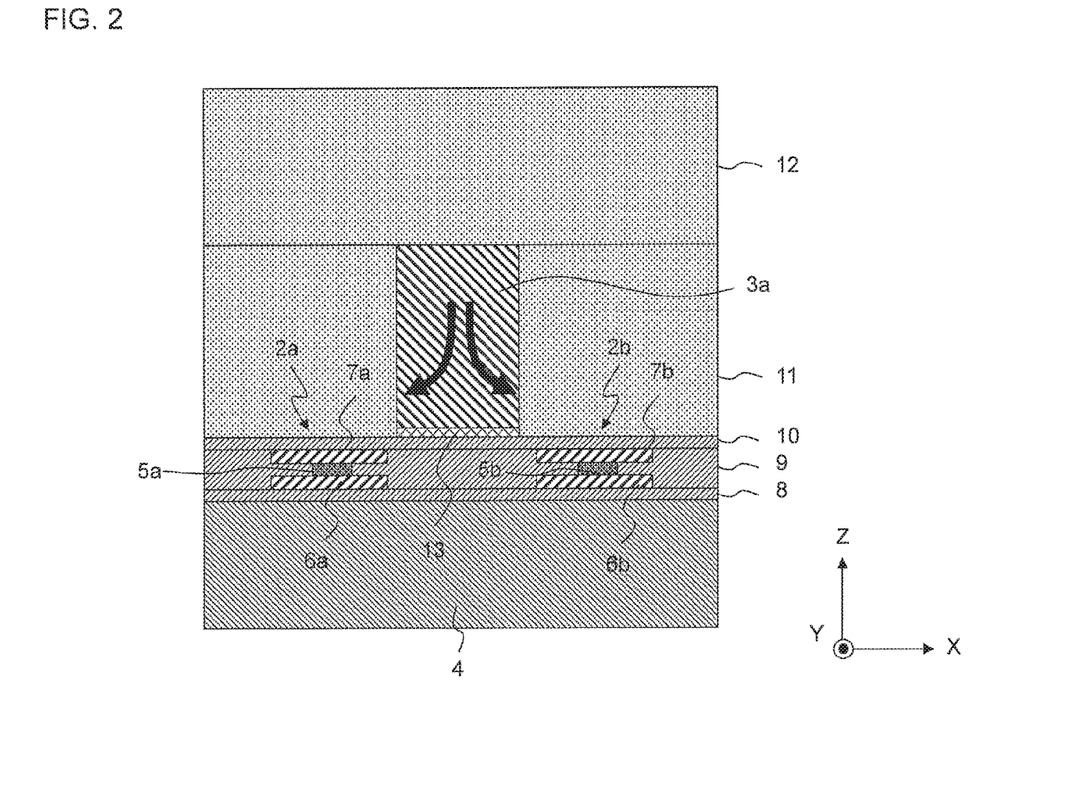
FIG. 2 is a cross sectional view of the magnetic sensor shown in FIG. 1 in a X-Z plane.

FIG. 2 shows a cross sectional view of magnetic sensor 1 in a X-Z plane cut along line A-A in FIG. 1. FIG. 2 only depicts first and second magnetic field detecting elements 2a, 2b and yoke 3a, but third and fourth magnetic field detecting element 2c, 2d and yoke 3b are constituted and arranged in the same manner as first and second magnetic field detecting elements 2a, 2b and first yoke 3a, respectively. First and second magnetic field detecting elements 2a, 2b are formed above substrate 4 via first insulating layer 8. Second insulating layer 9 is formed on the lateral sides of first and second magnetic field detecting elements 2a, 2b. Third insulating layer 10 is formed on first and second magnetic field detecting elements 2a, 2b. First yoke 3a is provided above third insulating layer 10. First yoke 3a is formed by plating. Thus, electrode film 13 that is used in the plating process is interposed between third insulating layer 10 and first yoke 3a. Fourth insulating layer 11 is formed on the lateral sides of first yoke 3a. Fifth insulating layer 12 is formed on first yoke 3a and fourth insulating layer 11. First to fifth insulating layers 8-12 are formed, for example, of $Al_2O_3$.

First magnetic field detecting element 2a has first magnetic field sensing film 5a that detects a magnetic field in first direction X and first pair of leads 6a, 7a that interpose first magnetic field sensing film 5a in third direction Z and that supply a sensing current to first magnetic field sensing film 5a. Second magnetic field detecting element 2b has second magnetic field sensing film 5b that detects a magnetic field in first direction X and second pair of leads 6b, 7b that interpose second magnetic field sensing film 5b in third direction Z and that supply a sensing current to second magnetic field sensing film 5b. The sensing current flows in third direction Z. First yoke 3a is arranged between first magnetic field detecting element 2a and second magnetic field detecting element 2b in first direction X. As seen in Z direction, first yoke 3a is arranged between pair of leads 6a, 7a of first magnetic field detecting element 2a and pair of leads 6b, 7b of second magnetic field detecting element 2b in X direction. In addition, first yoke 3a does not overlap with pair of leads 6a, 7a of first magnetic field detecting element 2a nor with pair of leads 6b, 7b of second magnetic field detecting element 2b, as seen in Z direction.

Figure 3:
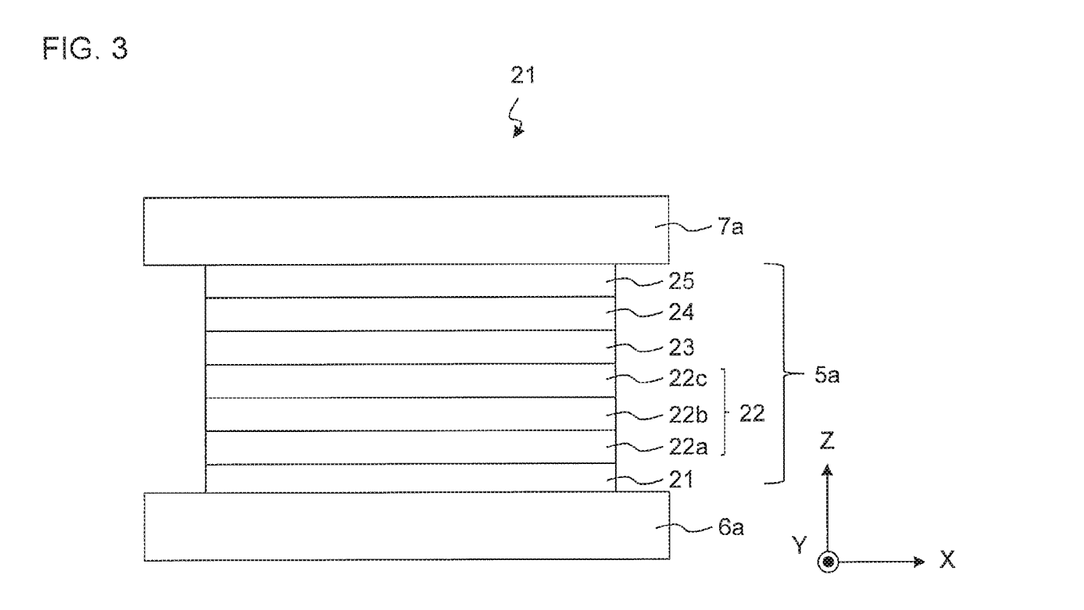
FIG. 3 is a conceptual cross sectional view showing the configuration of a magnetic field detecting sensor.

Next, explanation will be given about first and second magnetic field detecting elements 2a, 2b. Since first magnetic field detecting element 2a and second magnetic field detecting element 2b have the same structure, first magnetic field detecting element 2a will be explained here. FIG. 3 is a cross sectional view showing the structure of first magnetic field detecting element 2a in more detail. First magnetic field sensing film 5a of first magnetic field detecting element 2a includes magnetization free layer 24, magnetization pinned layer 22 and spacer layer 23 that is interposed between magnetization free layer 24 and magnetization pinned layer 22 and that exhibits magneto-resistive effect. Magnetization free layer 24 is formed of a soft magnetic body, such as NiFe, and the magnetization direction thereof, when an external magnetic field is applied, is rotated in a plane that includes first direction X and second direction Y. Magnetization free layer 24 is sufficiently longer in second direction Y than in first direction X, and the magnetization direction is aligned in second direction Y due to the shape anisotropy effect. Bias layers that are formed of a hard magnetic material may be provided on both sides of magnetization free layer 24 in the Y direction in order to align the magnetization direction of magnetization free layer 24 in second direction Y. Magnetization pinned layer 22 is formed of a soft magnetic body, such as CoFe, and the magnetization direction is pinned relative to an external magnetic field. Spacer layer 23 is a tunneling barrier layer that is formed of a nonmagnetic insulating material, such as $Al_2O_3$. Accordingly, first magnetic field detecting element 2a of this embodiment is a TMR (Tunnel Magneto Resistive) element. It should be noted that first magnetic field detecting element 2a is not limited to a TMR element as long as it can detect a magnetic field in first direction X, and first magnetic field detecting element 2a may be a magnetic field detecting element such as a GMR (Giant Magneto Resistive) element that utilizes a nonmagnetic metal layer, such as a Cu layer, for spacer layer 23 or an AMR (An-Isotropic Magneto Resistive) element.

Magnetization pinned layer 22 consists of first magnetization pinned layer 22a, nonmagnetic intermediate layer 22b and second magnetization pinned layer 22c that are stacked in this order, with first magnetization pinned layer 22a being formed on seed layer 21 that is formed of Ta or Ru. Second magnetization pinned layer 22c is in contact with spacer layer 23. First magnetization pinned layer 22a and second magnetization pinned layer 22c are formed of a soft magnetic body, such as CoFe, and nonmagnetic intermediate layer 22b is formed of Ru. First magnetization pinned layer 22a and second magnetization pinned layer 22c are anti-ferromagnetically coupled to each other via nonmagnetic intermediate layer 22b. An anti-ferromagnetic layer (not shown) that is formed, for example, of IrMn, and that exchange-couples with first magnetization pinned layer 22a may be provided under first magnetization pinned layer 22a.

Magnetization free layer 24 is covered with protection layer 25 that is formed of Ta or the like.

When an external magnetic field is applied to magnetic sensor 1 thus constructed in third direction Z, magnetic flux is absorbed by first yoke 3a (shown with the bold arrows in FIG. 2) and is bent in first direction X before exiting first yoke 3a. Since a magnetic field whose component in first direction X increases after the magnetic field passes through first yoke 3a is applied to first and second magnetic field detecting elements 2a, 2b, magnetic field in first direction X can be more effectively detected, as compared to a magnetic sensor that does not have first yoke 3a. Therefore, it is possible for magnetic sensor 1 to detect an external magnetic field in third direction Z that corresponds to the magnetic field strength in first direction X.

Figure 4A:
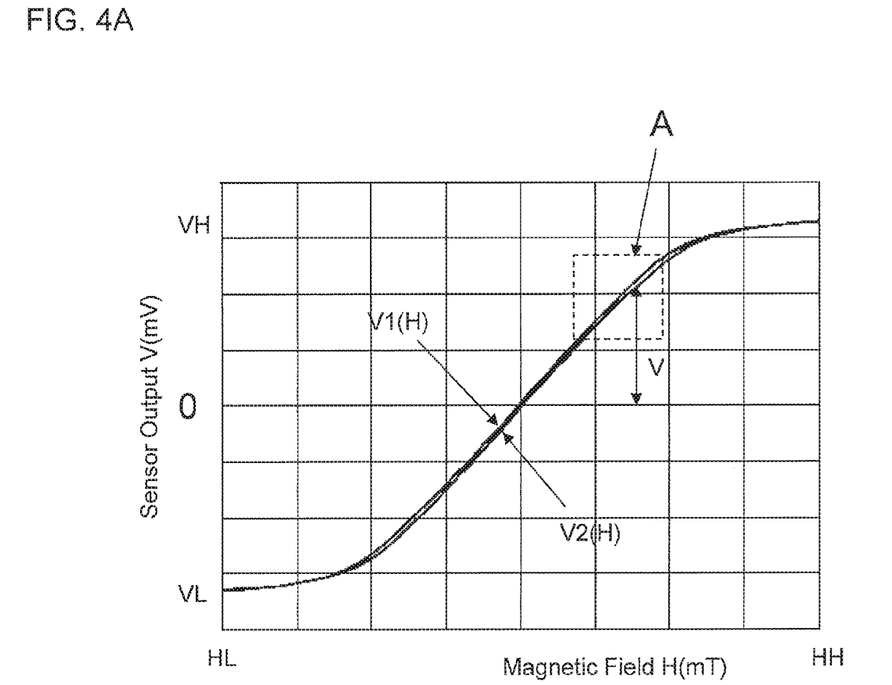
FIGS. 4A and 4B are schematic views showing hysteresis of a sensor output.
Figure 4B:
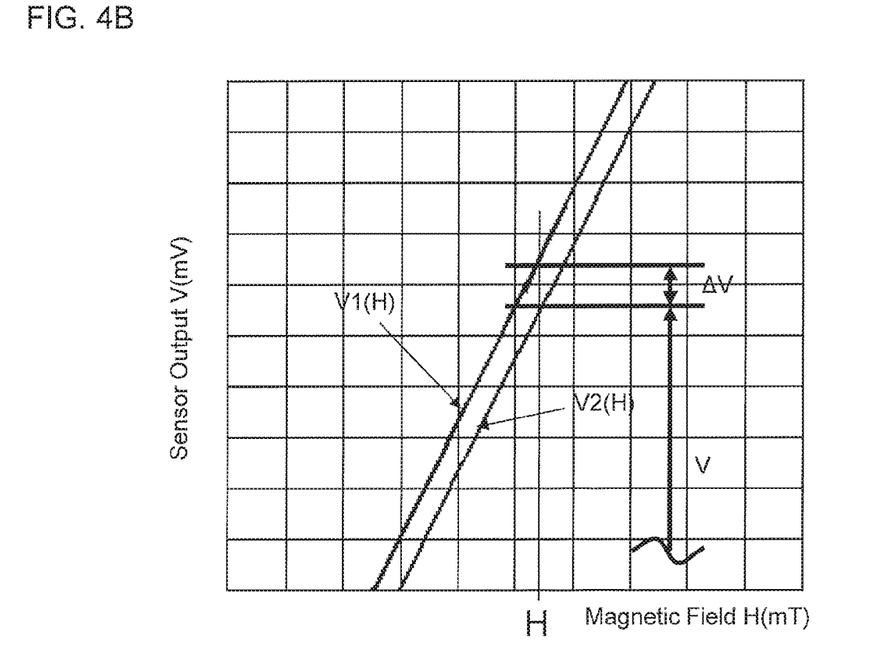

One of the characteristics of a magnetic sensor that detects an external magnetic field after the external magnetic field passes through a yoke that is formed of a soft magnetic body is that there is hysteresis in the sensor output. FIG. 4A schematically illustrates a relationship between an external magnetic field and a sensor output, and FIG. 4B shows an enlarged view of part A in FIG. 4A. V1(H) is sensor output when external magnetic field H whose strength is increasing in the third direction is applied to a yoke, and V2(H) is sensor output when external magnetic field H whose strength is decreasing in the third direction is applied to a yoke. The sensor output is a function of external magnetic field H. It is preferred that V1(H) completely coincide with V2(H), but actually, V1(H) does not completely coincide with V2(H). This means that external magnetic field H has a range within which $\Delta V=|V1(H)-V2(H)|$ is not zero. When $\Delta V$ is not zero, magnetic sensor 1 outputs V1(H) or V2(H) depending on whether the strength of the external magnetic field is increasing or decreasing. Therefore, when $\Delta V$ is large, the accuracy of magnetic sensor 1 deteriorates.

Magnetic sensor 1 of the present embodiment is characterized by the dimensions or the shape of first soft magnetic body 3a that is able to decrease the hysteresis of the sensor output. The dimensions or the shape of second soft magnetic body 3b may be the same as that of first soft magnetic body 3a, but may be different from that of first soft magnetic body 3a as long as the dimensions or the shape have the following characteristics. Examination will be given about first soft magnetic body 3a as an example. First soft magnetic body 3a has a substantially rectangular parallelepiped shape. Suppose that W is the length (width) of first soft magnetic body 3a in first direction X, L is the length of first soft magnetic body 3a in second direction Y and h is the length (height) of first soft magnetic body 3a in third direction Z.

Figure 5:
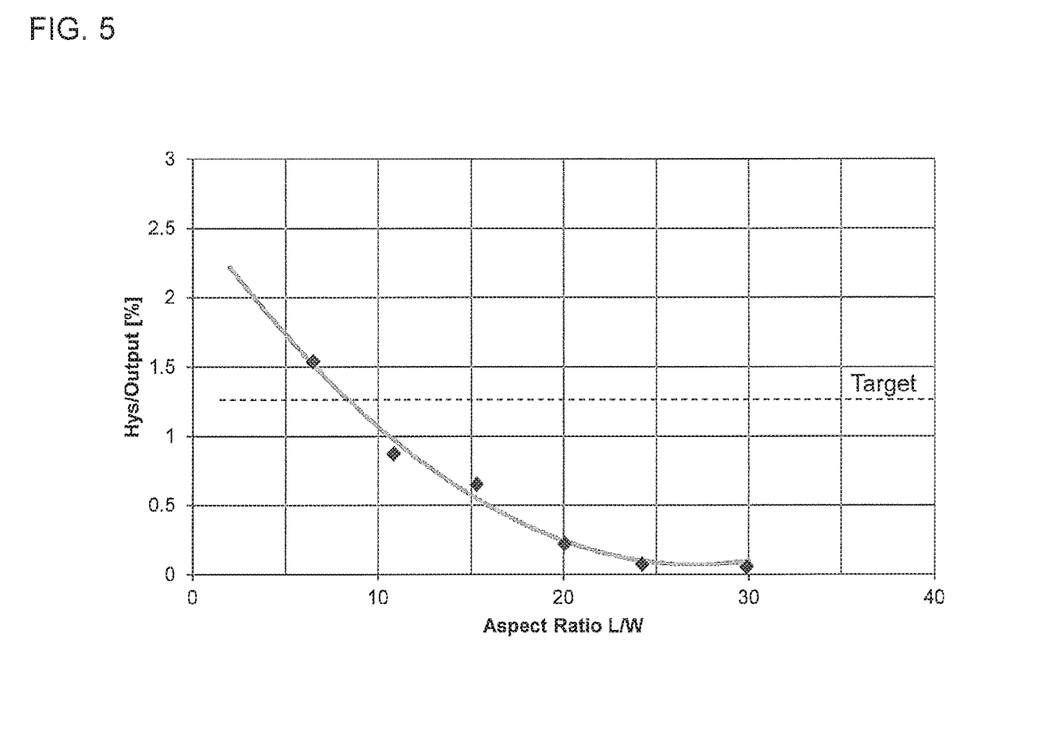
FIG. 5 is a graph showing a relationship between aspect ratio L/W and hysteresis.

FIG. 5 is a graph showing a relationship between aspect ratio L/W and Hymax, in which the axis of abscissas denotes L/W and the axis of ordinates denotes Hymax. Hy is defined as the ratio of $\Delta V$ to output range Vrange $(=\Delta V/Vrange)$, showing the magnitude of hysteresis relative to output range Vrange. Output range Vrange is differential VH−VL, where VH and VL are two saturation points of sensor output V. Saturation point VH is defined to be sensor output V1(H) that is outputted when the changing ratio of sensor output V1(H) to external magnetic field H whose component in third direction Z is increasing with time becomes half of the maximum changing ratio. Similarly, saturation point VL is defined to be sensor output V2(H) that is outputted when the changing ratio of sensor output V2(H) to external magnetic field H whose component in third direction Z is decreasing with time becomes half of the maximum changing ratio. Here, VH>VL. By changing external magnetic field H between external magnetic fields HL and HH (see FIGS. 4A and 4B) that correspond to VL and VH, respectively, $\Delta V$ is calculated for each value of H. The axis of ordinates in FIG. 5 denotes maximum value Hymax of Hy=$\Delta V$/Vrange. In other words, Hymax is defined to be $$Hy\max = \frac{\Delta V \max}{Vrange} = \frac{|V1(H)-V2(H)|\max}{VH-VL}$$

V1(H) is the sensor output when external magnetic field H whose component in third direction Z is increasing with time is applied to first soft magnetic body 3a, and V2(H) is the sensor output when external magnetic field H whose component in third direction Z is decreasing with time is applied to first soft magnetic body 3a.

In FIG. 5, width W is a variable while length L of first soft magnetic body 3a is a constant (78 μm). The approximation curve that shows the relationship between aspect ratio LNV and Hymax is approximated by a polynomial. The upper limit of Hymax is preferably set to be about 1.25%. Magnetic sensor 1 of the present embodiment may be used, for example, to detect the position of a lens of a camera module. When Hymax is 1.25%, the error in detecting the position of a lens that is movable, for example, within +−200 μm can be limited to 5 μm or less. This level of accuracy is satisfactory for a general camera module. From FIG. 5, L/W is preferably equal to or more than 10. Although Hymax is decreased with an increase of L/W, Hymax is substantially saturated in the range of L/W of 20 or more, and Hymax can be limited to a sufficiently low level. Accordingly, L/W is more preferably equal to or more than 20. Since Hymax is saturated as L/W becomes large, it is not effective to set L/W extremely large. On the other hand, increasing L/W leads to an increase of length L and may affect the outer dimensions of magnetic sensor 1 since reducing width W is difficult because of the manufacturing reasons. Accordingly, L/W is preferably equal to or less than 40.

Figure 6:
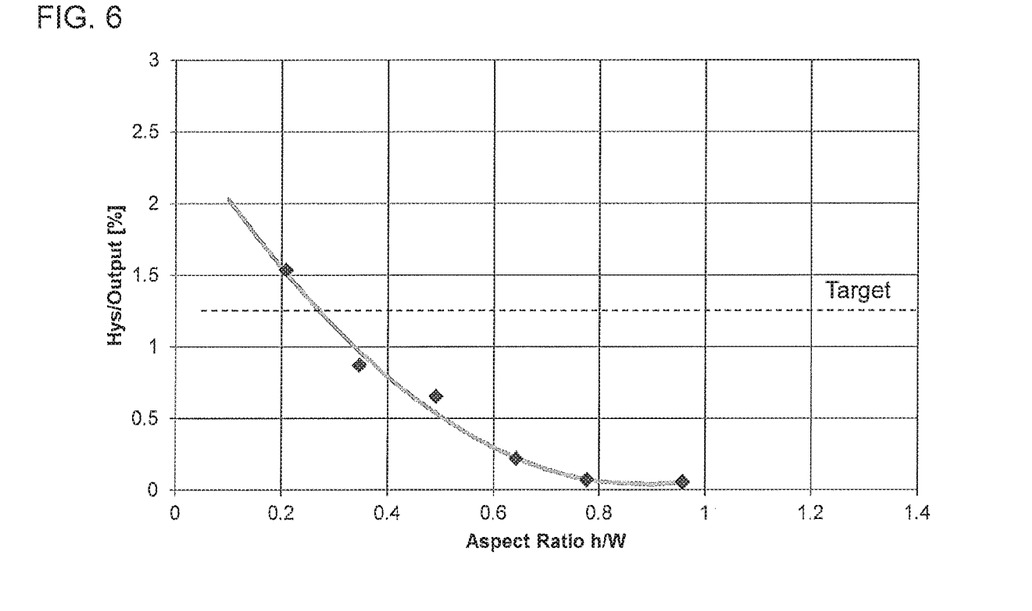
FIG. 6 is a graph showing a relationship between aspect ratio h/W and hysteresis.

FIG. 6 is a graph showing a relationship between aspect ratio L/h and Hymax, in which the axis of abscissas denotes h/W and the axis of ordinates denotes Hymax. Hymax is calculated in the same manner as in FIG. 5. Width W of first soft magnetic body 3a is a variable while length L is a constant (78 μm) and height h is a constant (2.5 μm). The approximation curve that shows the relationship between aspect ratio h/W and Hymax is approximated by a polynomial.

Referring to FIG. 6, h/W is preferably equal to or more than 0.27. Hymax is decreased as h/W becomes large. However, increasing h/W requires decreasing width W or increasing height h, and both are difficult because of the manufacturing reasons. Accordingly, the upper limit of h/W is preferably set to be 3. In addition, since Hymax tends to be saturated as h/W becomes large, h/W is preferably set to satisfy the formula: about 0.27=<h/W< about 1.5 from practical point of view.

First soft magnetic body 3a may have various shapes other than rectangular parallelepiped. In general, either one of a side that extends in first direction X, a side that extends in second direction Y or a side that extends in third direction Z may be nonlinear or may be a curve or may be a combination of a curve and a straight line. Alternatively, first soft magnetic body 3a may be asymmetrical with regard to at least either one of first direction X, second direction Y and third direction Z. In this case, length (width) W in first direction X may be defined as an average that is taken along second direction Y or third direction Z. When a constant width portion occupies a majority in second direction Y or in third direction Z, width W may be defined to be the width of the constant width portion. The same can be applied to length L in second direction Y and length (height) h in third direction Z.

Figure 7A:
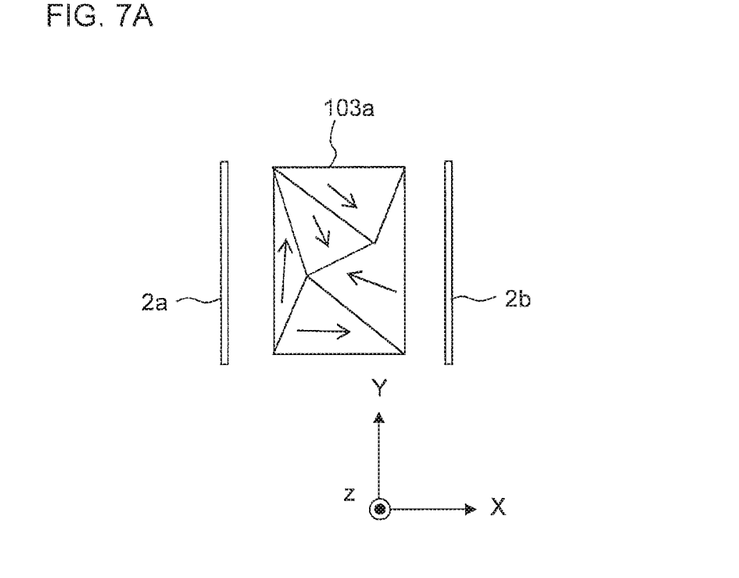
FIGS. 7A and 7B are schematic views illustrating the mechanism in which hysteresis is limited in the present invention.
Figure 7B:
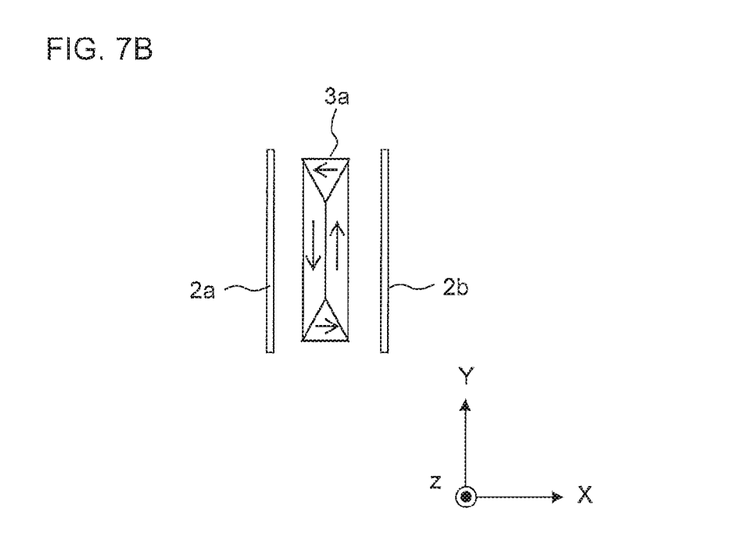

The reason why the hysteresis of the sensor output can be limited by adjusting the ranges of L/W and h/W will be summarized below. FIG. 7A is a conceptual view of a magnetic sensor according to a comparative example, as seen in third direction Z, and FIG. 7B is a conceptual view of a magnetic sensor according to the present embodiment, as seen in third direction Z. Yoke 103a of the comparative example and yoke 3a of the present embodiment are divided into a plurality of magnetic domains. An example of the magnetization directions of the magnetic domains is illustrated in the figures. In the comparative example, magnetization directions of the magnetic domains are randomly distributed in first direction X, second direction Y and third direction Z. When an external magnetic field is applied to the yoke in this state in the third direction, hysteresis of sensor output easily occurs. On the other hand, it is assumed in the present embodiment, in which the ranges of L/W and h/W are set as described above, that the magnetization of yoke 3a tends to be uniformly changed when the magnetic field is changed, and thus, hysteresis is limited.

Although certain preferred embodiments of the present invention have been shown and described in detail, it should be understood that various changes and modifications may be made without departing from the spirit or scope of the appended claims.

LIST OF REFERENCE NUMERALS

1 Magnetic sensor
2a, 2b, 2c, 2d First to Fourth Magnetic Field Detecting Element
3a, 3b First and Second Soft Magnetic Body (Yoke)
W Length (Width) of Yoke in First Direction X
L Length of Yoke in Second Direction Y
h Length (Height) of Yoke in Third direction Z

What is claimed is:

1. A magnetic sensor comprising:
a first magnetic field detecting element and a second magnetic field detecting element that are arranged in a plane that includes a first direction and a second direction that is perpendicular to the first direction, wherein the first and second magnetic field detecting elements detect a magnetic field in the first direction, and wherein each of the first and second magnetic field detecting elements has a magnetic field sensing film that detects a magnetic field in the first direction and a lead that supplies a sensing current to the magnetic field sensing film; and
a soft magnetic body that is arranged between the lead of the first magnetic field detecting element and the lead of the second magnetic field detecting element in the first direction, wherein
L/W is equal to or more than 10, where W is a length of the soft magnetic body in the first direction, and L is a length of the soft magnetic body in the second direction,
the lead of the first magnetic field detecting element and the lead of the second magnetic field detecting element are positioned near the soft magnetic body,
the magnetic sensor further includes a third magnetic field detecting element and a fourth magnetic field detecting element that are arranged in the plane that includes the first direction and the second direction, wherein the third and fourth magnetic field detecting elements detect a magnetic field in the first direction,
each of the third and fourth magnetic field detecting elements has a magnetic field sensing film that detects a magnetic field in the first direction and a lead that supplies a sensing current to the magnetic field sensing film,
the magnetic sensor further includes another soft magnetic body that is arranged between the lead of the third magnetic field detecting element and the lead of the fourth magnetic field detecting element in the first direction,
L/W is equal to or more than 10, where W is a length of said another soft magnetic body in the first direction, and L is a length of said another soft magnetic body in the second direction,
the first magnetic field detecting element, the soft magnetic body, the second magnetic field detecting element, the third magnetic field detecting element, said another soft magnetic body and the fourth magnetic field detecting element are arranged in that order in the first direction, and
in the first direction, the second magnetic field detecting element and the third magnetic field detecting element are positioned closer to the soft magnetic body and said another soft magnetic body than a line, respectively, wherein the line extends in the second direction and is equidistant both from the second magnetic field detecting element and from the third magnetic field detecting element.

2. The magnetic sensor according to claim 1, wherein the soft magnetic body neither overlaps with the lead of the first magnetic field detecting element nor the lead of the second magnetic field detecting element in the first direction, as viewed in a third direction that is perpendicular both to the first direction and to the second direction.

3. The magnetic sensor according to claim 1, wherein L/W is equal to or more than 40.

4. The magnetic sensor according to claim 1, wherein, as viewed in the second direction, the lead of the first magnetic field detecting element and the lead of the second magnetic field detecting element do not overlap with the soft magnetic body in a third direction that is perpendicular both to the first direction and to the second direction.

5. A magnetic sensor comprising:
at least one magnetic field detecting element that is arranged in a plane that includes a first direction and a second direction that is perpendicular to the first direction, wherein the at least one magnetic field detecting element detects a magnetic field in the first direction, and wherein the at least one magnetic field detecting element has a magnetic field sensing film that detects a magnetic field in the first direction and a lead that supplies a sensing current to the magnetic field sensing film; and
a first soft magnetic body and a second soft magnetic body that are arranged on both sides of the at least one magnetic field detecting element in the first direction, wherein
the first soft magnetic body and the second soft magnetic body have a same length W in the first direction and a same length L in the second direction, and L/W is equal to or more than 10, and
the lead of the at least one magnetic field detecting element is positioned either near the first soft magnetic body or near the second soft magnetic body.

6. The magnetic sensor according to claim 5, wherein the at least one magnetic field detecting element includes a magnetic field detecting element that is positioned near the first soft magnetic body and another magnetic field detecting element that is positioned near the second soft magnetic body,
- in the first direction, the magnetic field detecting element that is positioned near the first soft magnetic body is positioned closer to the first soft magnetic body than a line, wherein the line extends in the second direction and is equidistant both from the first soft magnetic body and from the second first soft magnetic body, and
- in the first direction, said another magnetic field detecting element that is positioned near the second soft magnetic body is positioned closer to the second soft magnetic body than the line.

7. A magnetic sensor comprising:
- a first magnetic field detecting element and a second magnetic field detecting element that are arranged in a plane that includes a first direction and a second direction that is perpendicular to the first direction, wherein the first and second magnetic field detecting elements detect a magnetic field in the first direction, and wherein each of the first and second magnetic field detecting elements has a magnetic field sensing film that detects a magnetic field in the first direction and a lead that supplies a sensing current to the magnetic field sensing film; and
- a soft magnetic body that is arranged between the lead of the first magnetic field detecting element and the lead of the second magnetic field detecting element in the first direction, wherein
- $0.27 =< h/W =< 3$, where W is a length of the soft magnetic body in the first direction, h is a length of the soft magnetic body in a third direction that is perpendicular both to the first direction and to the second direction,
- the lead of the first magnetic field detecting element and the lead of the second magnetic field detecting element are positioned near the soft magnetic body,
- the magnetic sensor further includes a third magnetic field detecting element and a fourth magnetic field detecting element that are arranged in the plane that includes the first direction and the second direction, wherein the third and fourth magnetic field detecting elements detect a magnetic field in the first direction, and wherein each of the third and fourth magnetic field detecting elements has a magnetic field sensing film that detects a magnetic field in the first direction and a lead that supplies a sensing current to the magnetic field sensing film,
- the magnetic sensor further includes another soft magnetic body that is arranged between the lead of the third magnetic field detecting element and the lead of the fourth magnetic field detecting element in the first direction,
- $0.27 =< h/W =< 3$, where W is a length of said another soft magnetic body in the first direction, and h is a length of said another soft magnetic body in the third direction,
- the first magnetic field detecting element, the soft magnetic body, the second magnetic field detecting element, the third magnetic field detecting element, said another soft magnetic body and the fourth magnetic field detecting elements are arranged in that order in the first direction, and
- in the first direction, the second magnetic field detecting element and the third magnetic field detecting element are positioned closer to the soft magnetic body and said another soft magnetic body than a line, respectively, wherein the line extends in the second direction and is equidistant both from the second magnetic field detecting element and from the third magnetic field detecting element.

8. The magnetic sensor according to claim 7, wherein the soft magnetic body neither overlaps with the lead of the first magnetic field detecting element nor the lead of the second magnetic field detecting element in the first direction, as viewed in a third direction that is perpendicular both to the first direction and to the second direction.

9. The magnetic sensor according to claim 7, wherein L/W is equal to or more than 40.

10. The magnetic sensor according to claim 7, wherein, as viewed in the second direction, the lead of the first magnetic field detecting element and the lead of the second magnetic field detecting element do not overlap with the soft magnetic body in a third direction that is perpendicular both to the first direction and to the second direction.

11. A magnetic sensor comprising:
- at least one magnetic field detecting element that is arranged in a plane that includes a first direction and a second direction that is perpendicular to the first direction, wherein the at least one magnetic field detecting element detects a magnetic field in the first direction, and wherein the at least one magnetic field detecting element has a magnetic field sensing film that detects a magnetic field in the first direction and a lead that supplies a sensing current to the magnetic field sensing film; and
- a first soft magnetic body and a second soft magnetic body that are arranged on both sides of the at least one magnetic field detecting element in the first direction, wherein
- the first soft magnetic body and the second soft magnetic body have a same length W in the first direction and a same length h in a third direction that is perpendicular both to the first direction and to the second direction, and $0.27 =< h/W =< 3$, and
- the lead of the at least one magnetic field detecting element is positioned either near the first soft magnetic body or near the second soft magnetic body.

12. The magnetic sensor according to claim 11, wherein the at least one magnetic field detecting element includes a magnetic field detecting element that is positioned near the first soft magnetic body and another magnetic field detecting element that is positioned near the second soft magnetic body,
- in the first direction, the magnetic field detecting element that is positioned near the first soft magnetic body is positioned closer to the first soft magnetic body than a line, wherein the line extends in the second direction and is equidistant both from the first soft magnetic body and from the second first soft magnetic body, and
- in the first direction, said another magnetic field detecting element that is positioned near the second soft magnetic body is positioned closer to the second soft magnetic body than the line.

13. A magnetic sensor comprising:
- a first magnetic field detecting element and a second magnetic field detecting element that are arranged in a plane that includes a first direction and a second direction that is perpendicular to the first direction, wherein the first and second magnetic field detecting elements detect a magnetic field in the first direction, and wherein each of the first and second magnetic field detecting elements has a magnetic field sensing film that detects a magnetic field in the first direction and a lead that supplies a sensing current to the magnetic field sensing film; and a soft magnetic body that is arranged between the lead of the first magnetic field detecting element and the lead of the second magnetic field detecting element in the first direction, wherein L/W is equal to or more than 10, where W is a length of the soft magnetic body in the first direction, and L is a length of the soft magnetic body in the second direction, and a gap between the lead of the first magnetic field detecting element and the soft magnetic body in the first direction is less than the length W, and a gap between the lead of the second magnetic field detecting element and the soft magnetic body in the first direction is less than the length W.

14. A magnetic sensor comprising:

a first magnetic field detecting element and a second magnetic field detecting element that are arranged in a plane that includes a first direction and a second direction that is perpendicular to the first direction, wherein the first and second magnetic field detecting elements detect a magnetic field in the first direction, and wherein each of the first and second magnetic field detecting elements has a magnetic field sensing film that detects a magnetic field in the first direction and a lead that supplies a sensing current to the magnetic field sensing film; and a soft magnetic body that is arranged between the lead of the first magnetic field detecting element and the lead of the second magnetic field detecting element in the first direction, wherein $0.27 = <h/W = <3$, where W is a length of the soft magnetic body in the first direction, h is a length of the soft magnetic body in a third direction that is perpendicular both to the first direction and to the second direction, and a gap between the lead of the first magnetic field detecting element and the soft magnetic body in the first direction is less than the length W, and a gap between the lead of the second magnetic field detecting element and the soft magnetic body in the first direction is less than the length W.

15. A magnetic sensor comprising:

a first magnetic field detecting element and a second magnetic field detecting element that are arranged in a plane that includes a first direction and a second direction that is perpendicular to the first direction, wherein the first and second magnetic field detecting elements detect a magnetic field in the first direction, and wherein each of the first and second magnetic field detecting elements has a magnetic field sensing film that detects a magnetic field in the first direction and a lead that supplies a sensing current to the magnetic field sensing film; and first and second soft magnetic bodies that are arranged in the first direction, wherein the first soft magnetic body is arranged between the lead of the first magnetic field detecting element and the lead of the second magnetic field detecting element in the first direction, the lead of the second magnetic field detecting element is arranged between the first soft magnetic body and the second soft magnetic body and closer to first soft magnetic body than the second soft magnetic body, and L/W is equal to or more than 10, where W is a length of the soft magnetic body in the first direction, and L is a length of the soft magnetic body in the second direction.

16. A magnetic sensor comprising:

a first magnetic field detecting element and a second magnetic field detecting element that are arranged in a plane that includes a first direction and a second direction that is perpendicular to the first direction, wherein the first and second magnetic field detecting elements detect a magnetic field in the first direction, and wherein each of the first and second magnetic field detecting elements has a magnetic field sensing film that detects a magnetic field in the first direction and a lead that supplies a sensing current to the magnetic field sensing film; and first and second soft magnetic bodies that are arranged in the first direction, wherein the first soft magnetic body is arranged between the lead of the first magnetic field detecting element and the lead of the second magnetic field detecting element in the first direction, the lead of the second magnetic field detecting element is arranged between the first soft magnetic body and the second soft magnetic body and closer to first soft magnetic body than the second soft magnetic body, and $0.27 = <h/W = <3$, where W is a length of the soft magnetic body in the first direction, h is a length of the soft magnetic body in a third direction that is perpendicular both to the first direction and to the second direction.

* * * * *